(12) United States Patent
Kim

(10) Patent No.: US 8,674,733 B2
(45) Date of Patent: Mar. 18, 2014

(54) PHASE CONTROL CIRCUIT

(75) Inventor: Ki Han Kim, Icheon-si (KR)

(73) Assignee: SK Hynix Inc.

( * ) Notice: Subject to any disclaimer, the term of this patent is extended or adjusted under 35 U.S.C. 154(b) by 149 days.

(21) Appl. No.: 13/219,616

(22) Filed: Aug. 27, 2011

(65) Prior Publication Data
US 2012/0212268 A1    Aug. 23, 2012

(30) Foreign Application Priority Data
Feb. 22, 2011    (KR) .................. 10-2011-0015394

(51) Int. Cl.
*H03L 7/06*    (2006.01)

(52) U.S. Cl.
USPC ............................ 327/158; 327/156; 375/376

(58) Field of Classification Search
USPC .................................. 327/156, 158; 375/376
See application file for complete search history.

(56) References Cited

U.S. PATENT DOCUMENTS

| | | | |
|---|---|---|---|
| 6,934,215 B2* | 8/2005 | Chung et al. ............. | 365/233.12 |
| 7,358,784 B2* | 4/2008 | Kim et al. .................... | 327/158 |
| 7,598,783 B2* | 10/2009 | Shin et al. ..................... | 327/158 |
| 7,830,187 B2* | 11/2010 | Chung et al. .................. | 327/158 |
| 7,990,194 B2* | 8/2011 | Shim ............................. | 327/158 |
| 8,040,169 B2* | 10/2011 | Chung et al. .................. | 327/158 |
| 8,242,821 B2* | 8/2012 | Bae et al. ...................... | 327/158 |
| 2007/0069781 A1* | 3/2007 | Kim et al. ..................... | 327/158 |
| 2010/0052745 A1* | 3/2010 | Chung et al. .................. | 327/149 |
| 2010/0164566 A1* | 7/2010 | Ku ................................. | 327/149 |
| 2010/0289542 A1* | 11/2010 | Yun et al. ...................... | 327/158 |
| 2010/0321076 A1* | 12/2010 | Bae et al. ...................... | 327/158 |
| 2011/0102039 A1* | 5/2011 | Shin ............................... | 327/175 |

FOREIGN PATENT DOCUMENTS

| | | |
|---|---|---|
| JP | 2005-039636 A | 2/2005 |
| KR | 1020100135552 A | 12/2010 |

* cited by examiner

*Primary Examiner* — Ryan Jager
(74) *Attorney, Agent, or Firm* — William Park & Associates Patent Ltd.

(57) ABSTRACT

A phase control circuit includes a first duty cycle correction circuit configured to correct a duty cycle of a clock signal; a delay locked loop configured to perform delay locking of an output signal of the first duty cycle correction circuit; and a second duty cycle correction circuit configured to correct a duty cycle of an output signal of the delay locked loop, wherein the first duty cycle correction circuit and the second duty cycle correction circuit are selectively activated depending upon an operating condition.

15 Claims, 5 Drawing Sheets

PHASE CONTROL CIRCUIT

CROSS-REFERENCES TO RELATED APPLICATION

The present application claims priority under 35 U.S.C. §119(a) to Korean application number 10-2011-0015394, filed on Feb. 22, 2011, in the Korean Intellectual Property Office, which is incorporated herein by reference in its entirety as set forth in full.

BACKGROUND

1. Technical Field

The present invention relates generally to a semiconductor circuit, and more particularly, to a phase control circuit.

2. Related Art

Phase control circuits may include a phase locked loop circuit and a delay locked loop circuit.

A delay locked loop circuit may be used to compensate for a timing variation of clock signals. The delay locked loop may be used to change the phase of a clock signal, usually to improve, for example, the clock rise-to-data output valid timing characteristics of integrated circuits such as DRAM devices.

SUMMARY

A phase control circuit which can widen an operation frequency range is described herein.

In one embodiment of the present invention, a phase control circuit includes: a first duty cycle correction circuit configured to correct a duty cycle of a clock signal; a delay locked loop configured to perform delay locking of an output signal of the first duty cycle correction circuit; and a second duty cycle correction circuit configured to correct a duty cycle of an output signal of the delay locked loop, wherein the first duty cycle correction circuit and the second duty cycle correction circuit are selectively activated depending upon an operating condition.

In another embodiment of the present invention, a phase control circuit includes: a first duty cycle correction circuit configured to correct a duty cycle of a clock signal and generate a reference clock signal; a first loop configured to generate a first preliminary clock signal in response to the reference clock signal; a second loop configured to generate a second preliminary clock signal in response to the reference clock signal; a second duty cycle correction circuit configured to correct a duty cycle of the first preliminary clock signal using the second preliminary clock signal; and an operating condition determination unit configured to determine frequency information of the clock signal and selectively activate one or more of the first duty cycle correction circuit, the second duty cycle correction circuit and the second loop.

BRIEF DESCRIPTION OF THE DRAWINGS

Features, aspects, and embodiments are described in conjunction with the attached drawings, in which.

DETAILED DESCRIPTION

Hereinafter, a phase control circuit according to the present invention will be described below with reference to the accompanying drawings through exemplary embodiments.

Figure 1:
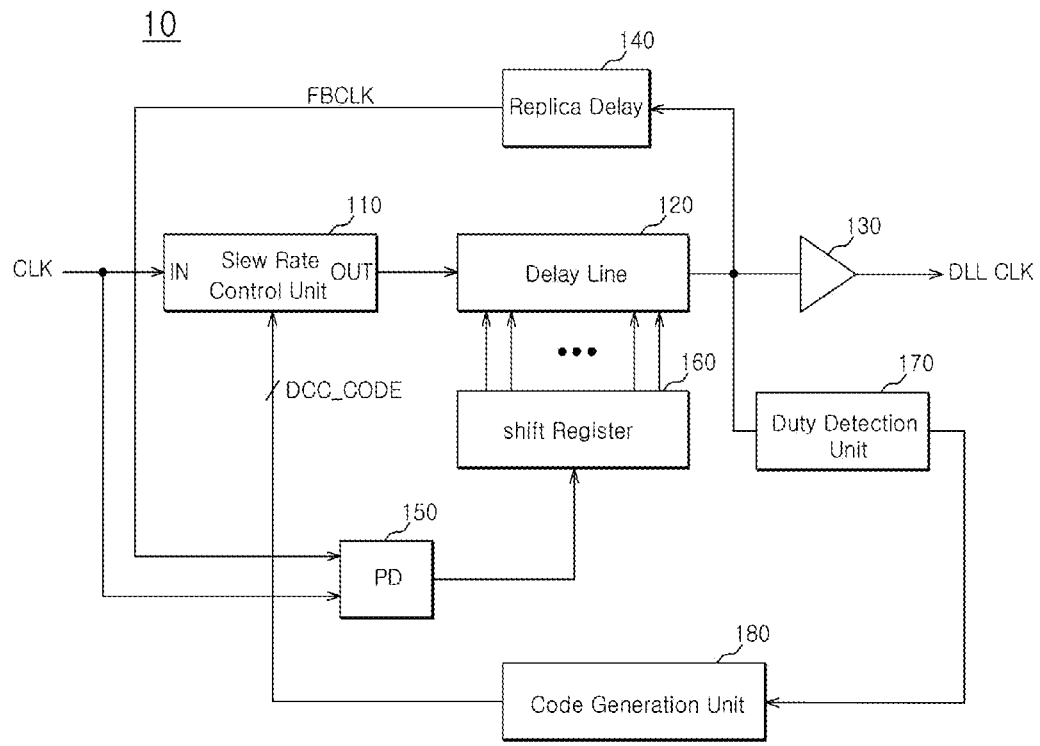
FIG. 1 is a block diagram showing a phase control circuit in accordance with an embodiment of the present invention.

Referring to FIG. 1, a phase control circuit 10 includes a slew rate correction unit 110, a delay line 120, a driver 130, a replica delay 140, a phase detector 150, a shift register 160, a duty detection unit 170, and a code generation unit 180.

The slew rate correction unit 110 is configured to control the slew rate of a clock signal CLK according to a code signal DCC_CODE so that the duty cycle of the clock signal CLK is corrected.

The delay line 120 is configured to delay the output signal of the duty cycle correction unit 110 by a variable delay time under the control of the shift register 160 and output a resultant signal.

The driver 130 is configured to drive the output signal of the delay line 120 and output a delay locked clock signal DLL CLK.

The replica delay 140 is set with a delay time that is acquired by modeling the internal signal processing delay time of a semiconductor integrated circuit.

The replica delay 140 is configured to delay the output signal of the delay line 120 and generate a feedback clock signal FBCLK.

The phase detector 150 is configured to compare the phases of the clock signal CLK and the feedback clock signal FBCLK and provide a comparison result to the shift register 160.

The duty detection unit 170 is configured to detect the duty of the output signal of the delay line 120.

The code generation unit 180 is configured to generate the code signal DCC_CODE in response to the output of the duty detection unit 170.

Figure 2:
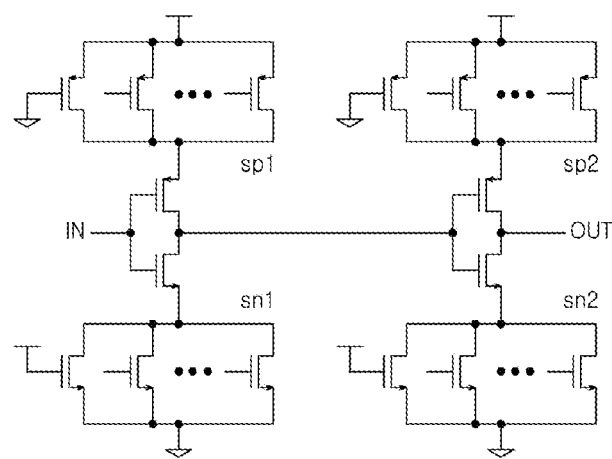
FIG. 2 is a circuit diagram of the slew rate control unit shown in FIG. 1.

Referring to FIG. 2, the slew rate control unit 110 includes a plurality of circuits sp1, sp2, sn1 and sn2, and is configured to control the slew rate of an input signal IN in such a manner that the plurality of circuits sp1, sp2, sn1 and sn2 selectively operate according to the code signal DCC_CODE.

In the phase control circuit described above, as a circuit for duty cycle correction, the slew rate correction unit 110 with a scheme of correcting a duty by controlling a slew rate is used.

In a circuit for correcting a duty cycle according to a slew rate control scheme, while a stable operation is ensured and a circuit configuration is simple for an input signal with a low frequency, a stable operation cannot be ensured for an input signal with a high frequency.

However, in a circuit for correcting a duty cycle according to a phase mixing scheme, a stable operation can be ensured even for an input signal with a high frequency.

A phase control circuit in accordance with an embodiment of the present invention may include a delay locked loop and a duty cycle corrector.

Figure 3:
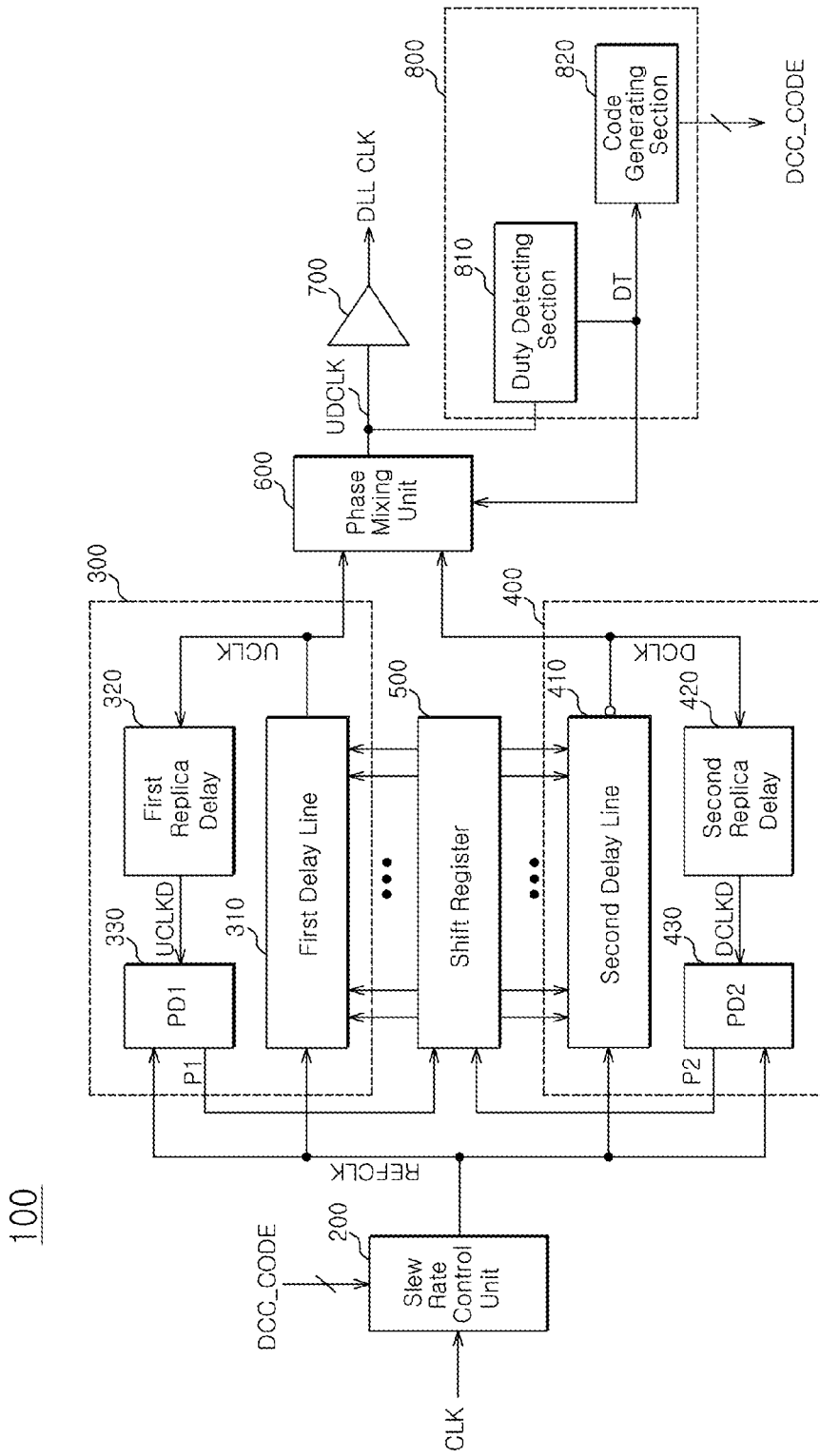
FIG. 3 is a block diagram showing a phase control circuit in accordance with another embodiment of the present invention.

Referring to FIG. 3, a phase control circuit 100 in accordance with an embodiment of the present invention includes a slew rate control unit 200, a first loop 300, a second loop 400, a shift register 500, a phase mixing unit 600, a driver 700, and a control unit 800.

The slew rate control unit 200 and the phase mixing unit 600 are configured to operate as first and second duty cycle correction (DCC) circuits.

The slew rate control unit 200 is configured to correct the duty cycle of a clock signal CLK in response to a code signal DCC_CODE.

The slew rate control unit 200 is configured to correct the duty cycle of the clock signal CLK by controlling the slew rate of the clock signal CLK.

A control amount of the slew rate may bu adjusted depending upon the value of the code signal DCC_CODE.

The slew rate control unit 200 outputs the clock signal CLK of which the duty cycle is corrected as a reference clock signal REFCLK.

The slew rate control unit 200 may be configured in the same manner as the slew rate control unit 110 shown in FIG. 1.

The first loop 300 is configured to perform a delay locking operation by adjusting the delay time of the reference clock signal REFCLK, and generate a first preliminary clock signal UCLK.

The first loop 300 includes a first delay line 310, a first replica delay 320, and a first phase detector (PD1) 330.

The first delay line 310 is configured to delay the reference clock signal REFCLK by the delay time adjusted by the shift register 500, and generate the first preliminary clock signal UCLK.

The first replica delay 320 is set with a delay time that is acquired by modeling the internal signal processing delay time of a semiconductor integrated circuit.

The first replica delay 320 is configured to delay the first preliminary clock signal UCLK and output a first feedback clock signal UCLKD.

The first phase detector 330 is configured to compare the phases of the first feedback clock signal UCLKD and the reference clock signal REFCLK, and output a first phase comparison signal P1.

The second loop 400 is configured to perform a delay locking operation by adjusting the delay time of the reference clock signal REFCLK, and generate a second preliminary clock signal DCLK.

The second loop 400 includes a second delay line 410, a second replica delay 420, and a second phase detector (PD2) 430.

The second delay line 410 is configured to delay the reference clock signal REFCLK by the delay time adjusted by the shift register 500, and generate the second preliminary clock signal DCLK.

The second replica delay 420 is set with a delay time that is acquired by modeling the internal signal processing delay time of a semiconductor integrated circuit. The second replica delay 420 may be set with the same delay time as the first replica delay 320.

The second replica delay 420 is configured to delay the second preliminary clock signal DCLK and output a second feedback clock signal DCLKD.

The second phase detector 430 is configured to compare the phases of the second feedback clock signal DCLKD and the reference clock signal REFCLK, and output a second phase comparison signal P2.

The shift register 500 serves as a delay control unit and is configured to adjust the delay times of the first loop 300 and the second loop 400 in response to the first phase comparison signal P1 and the second phase comparison signal P2.

The shift register 500 adjusts the delay time of the first delay line 310 in response to the first phase comparison signal P1.

The shift register 500 adjusts the delay time of the second delay line 410 in response to the second phase comparison signal P2.

The phase mixing unit 600 is configured to mix the first preliminary clock signal UCLK and the second preliminary clock signal DCLK using a weight generated in response to a duty detection signal DT, and generate a phase-mixed clock signal UDCLK.

The driver 700 is configured to drive the phase-mixed clock signal UDCLK and output a delay locked clock signal DLL CLK.

The control unit 800 is configured to control the slew rate control unit 200 and the phase mixing unit 600 in response to the phase-mixed clock signal UDCLK.

The control unit 800 includes a duty detecting section 810 and a code generating section 820.

The duty detecting section 810 is configured to compare the high level duration and low level duration of the phase-mixed clock signal UDCLK and output a comparison result as the duty detection signal DT.

For example, the duty detecting section 810 may be configured to output the duty detection signal DT with a logic high level in the case where the high level duration of the phase-mixed clock signal UDCLK is longer than the low level duration of the phase-mixed clock signal UDCLK, and output the duty detection signal DT with a logic low level in an opposite case.

The code generating section 820 is configured to generate the code signal DCC_CODE in response to the duty detection signal DT.

The code generating section 820 increases, maintains or decreases the value of the code signal DCC_CODE depending upon a logic level of the duty detection signal DT.

Figure 4:
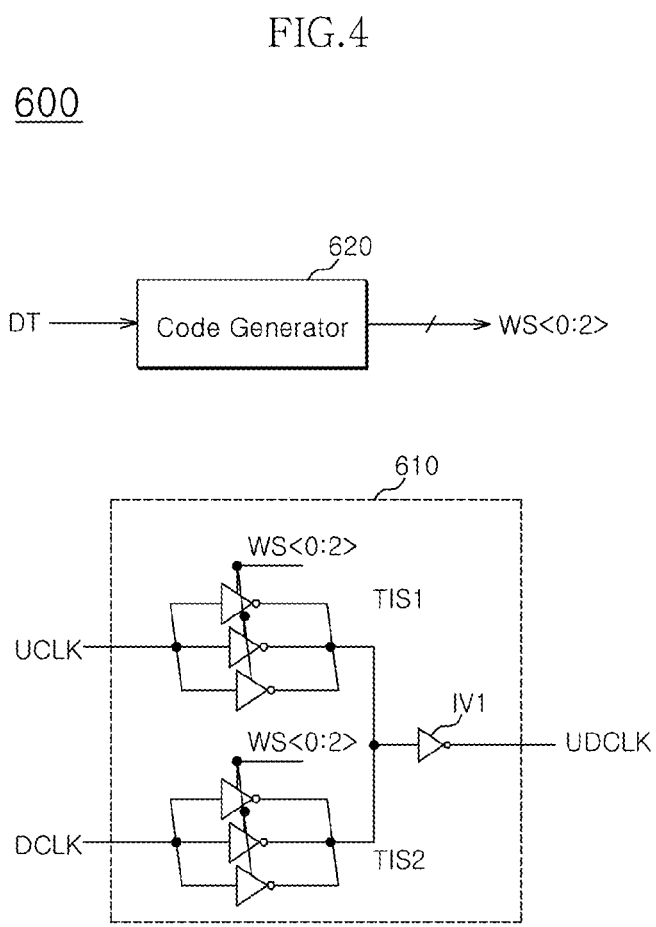
FIG. 4 is a circuit diagram of the phase mixing unit shown in FIG. 3.

Referring to FIG. 4, the phase mixing unit 600 includes a mixer 610 and a code generator 620.

The mixer 610 includes a plurality of tri-state inverter sets, e.g., a first tri-state inverter set TIS1 and a second tri-state inverter set TIS2. Also, the mixer 610 includes an inverter IV1.

The first tri-state inverter set TIS1 has an input terminal which is commonly connected with input terminals of tri-state inverters which constitute the first tri-state inverter set TIS1, and receives the first preliminary clock signal UCLK through the input terminal.

The first tri-state inverter set TIS1 has an output terminal which is commonly connected with output terminals of the tri-state inverters which constitute the first tri-state inverter set TIS1, and the output terminal is coupled to the input terminal of the inverter IV1.

The first tri-state inverter set TIS1 is selectively activated in response to weight control signals WS<0:2> which are activated.

The second tri-state inverter set TIS2 has an input terminal which is commonly connected with input terminals of tri-state inverters which constitute the second tri-state inverter set TIS2, and receives the second preliminary clock signal DCLK through the input terminal.

The second tri-state inverter set TIS2 has an output terminal which is commonly connected with output terminals of tri-state inverters which constitute the second tri-state inverter set TIS2, and the output terminal is coupled to the input terminal of the inverter IV1.

The second tri-state inverter set TIS2 is selectively activated in response to the weight control signals WS<0:2> which are deactivated.

For example, if the weight control signals WS<0:1> are activated among the weight control signals WS<0:2>, two tri-state inverters of the tri-state inverter set TIS1 are activated, whereas one tri-state inverter of the tri-state inverter set TIS2 is activated.

As a result, if the weight control signals WS<0:1> are activated (and the weight control signal WS<2> is deactivated) among the weight control signals WS<0:2>, the mixer 610 mixes the first preliminary clock signal UCLK and the second preliminary clock signal DCLK with a weight of 2:1, and generates the phase-mixed clock signal UDCLK.

In another example, if the weight control signals WS<0:1> are deactivated (and the weight control signal WS<2> is activated) among the weight control signals WS<0:2>, one tri-state inverter of the tri-state inverter set TIS1 is activated, whereas two tri-state inverters of the tri-state inverter set TIS2 are activated.

As a result, if the weight control signals WS<0:1> are deactivated among the weight control signals WS<0:2>, the mixer 610 mixes the first preliminary clock signal UCLK and the second preliminary clock signal DCLK with a weight of 1:2, and generates the phase-mixed clock signal UDCLK.

The code generator 610 generates the weight control signals WS<0:2> in response to the duty detection signal DT.

The code generator 610 may include a decoder. For example, the decoder may be configured to generate the weight control signals WS<0:2> in which the weight control signals WS<0:1> are activated when the duty detection signal DT is logic high, and to generate the weight control signal WS<0:2> in which the weight control signal WS<2> is activated when the duty detection signal DT is logic low.

As described above, the phase mixing unit 600 which includes a digital type mixer may improve duty correction performance for a high frequency signal.

Also, the phase mixing unit 600 may include an additional loop circuit, e.g., the second loop 400 for improving a high frequency operation.

According to an embodiment of the present invention, in order to cover various frequency (high frequency/low frequency) conditions, operations of the other circuits which are not necessary to be used are interrupted, thereby reducing current consumption, which will be described below in detail.

Figure 5:
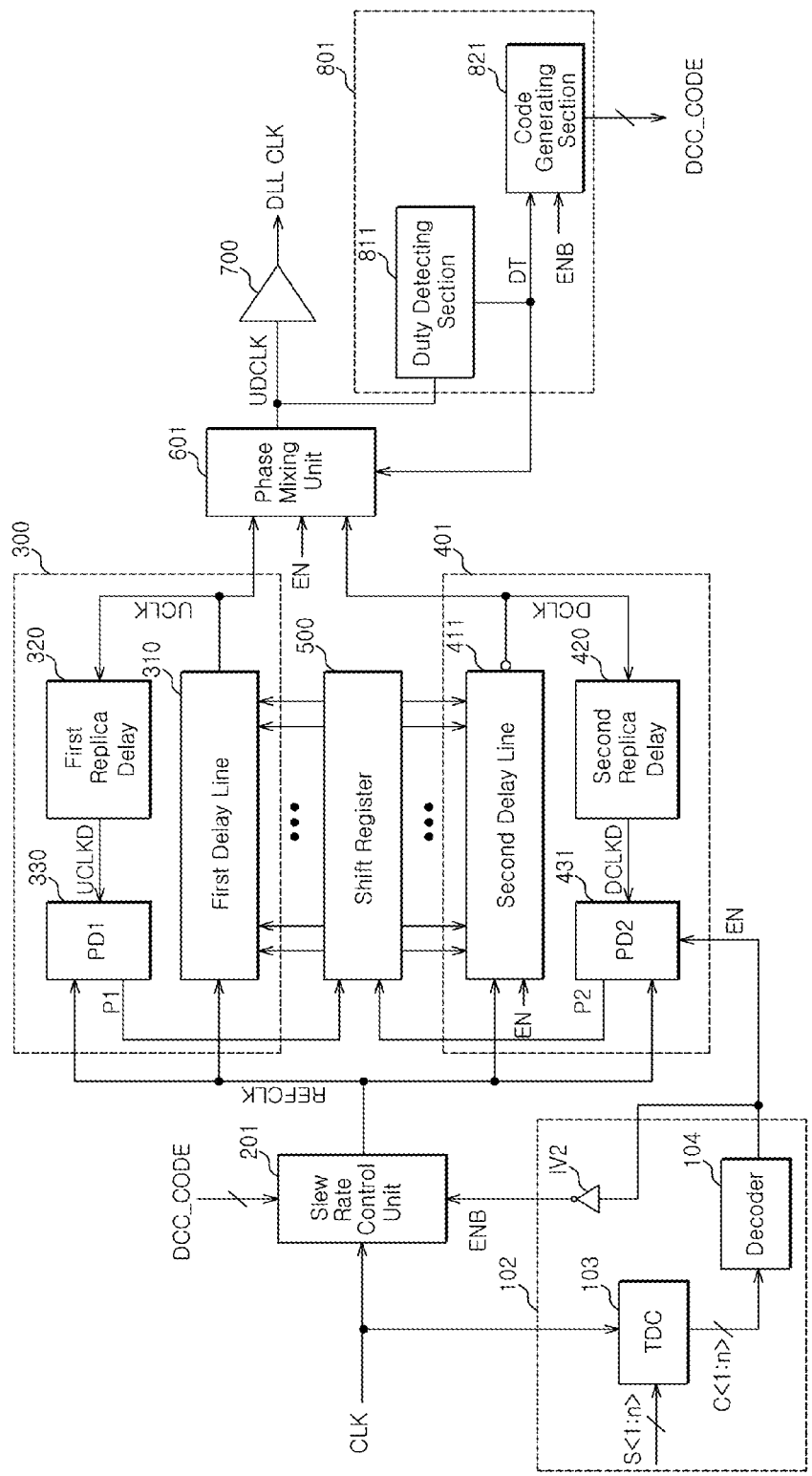
FIG. 5 is a block diagram showing a phase control circuit in accordance with still another embodiment of the present invention.

Referring to FIG. 5, a phase control circuit 101 in accordance with an embodiment of the present invention includes an operating condition determination unit 102, a slew rate control unit 201, a first loop 300, a second loop 401, a shift register 500, a phase mixing unit 601, a driver 700, and a control unit 801.

The slew rate control unit 201 and the phase mixing unit 601 are configured to operate as first and second duty cycle correction (DCC) circuits.

The operating condition determination unit 102 is configured to determine the frequency information (e.g., whether it is high frequency or low frequency) of a clock signal CLK as one of operating conditions of the phase control circuit 101, and generate an enable signal EN and an enable bar signal ENB.

The operating condition determination unit 102 includes a time/digital information converting section (TDC) 103, a decoder 104, and an inverter IV2.

The time/digital information converting section 103 is configured to generate preliminary frequency information C<1:n> using sampling values acquired by sampling the clock signal CLK and reference frequency information S<1:n>.

The decoder 104 is configured to decode the preliminary frequency information C<1:n> and generate the enable signal EN.

In the following descriptions, it is defined that the clock signal CLK has a high frequency in the case where the enable signal EN is logic high and a low frequency in the case where the enable signal EN is logic low.

According to an example, the high frequency and the low frequency are distinguished based on the reference frequency information S<1:n>. Accordingly, by controlling the value of the reference frequency information S<1:n> in conformity with the operating frequency characteristics of a semiconductor integrated circuit, an operating condition determination standard, that is, a high frequency/low frequency distinguishing standard may be changed.

The slew rate control unit 201 is configured to correct the duty cycle of the clock signal CLK in response to a code signal DCC_CODE.

The slew rate control unit 201 is configured to correct the duty cycle of the clock signal CLK by controlling the slew rate of the clock signal CLK.

The slew rate control unit 201 outputs the clock signal CLK of which the duty cycle is corrected as a reference clock signal REFCLK.

The slew rate control unit 201 may be configured in the same manner as the slew rate control unit 200 shown in FIG. 3, except that the slew rate control unit 201 is configured to be activated in response to the deactivation (to a logic high level) of the enable bar signal ENB.

The first loop 300 is configured to perform a delay locking operation by adjusting the delay time of the reference clock signal REFCLK, and generate a first preliminary clock signal UCLK.

The first loop 300 includes a first delay line 310, a first replica delay 320, and a first phase detector (PD1) 330.

The first delay line 310 is configured to delay the reference clock signal REFCLK by the delay time adjusted by the shift register 500, and generate the first preliminary clock signal UCLK.

The first replica delay 320 is set with a delay time that is acquired by modeling the internal signal processing delay time of a semiconductor integrated circuit.

The first replica delay 320 is configured to delay the first preliminary clock signal UCLK and output a first feedback clock signal UCLKD.

The first phase detector 330 is configured to compare the phases of the first feedback clock signal UCLKD and the reference clock signal REFCLK, and output a first phase comparison signal P1.

The second loop 401 is configured to perform a delay locking operation by adjusting the delay time of the reference clock signal REFCLK, and generate a second preliminary clock signal DCLK.

The second loop 401 includes a second delay line 411, a second replica delay 420, and a second phase detector (PD2) 431.

The second delay line 411 is configured to delay the reference clock signal REFCLK by the delay time adjusted by the shift register 500, and generate the second preliminary clock signal DCLK by inverting the delayed signal.

The second delay line 411 is configured to be activated when the enable signal EN is activated (to a logic high level).

The second replica delay 420 is set with a delay time that is acquired by modeling the internal signal processing delay time of a semiconductor integrated circuit. The second replica delay 420 may be set with the same delay time as the first replica delay 320.

The second replica delay 420 is configured to delay the second preliminary clock signal DCLK and output a second feedback clock signal DCLKD.

The second phase detector 431 is configured to compare the phases of the second feedback clock signal DCLKD and the reference clock signal REFCLK, and output a second phase comparison signal P2.

The second phase detector 431 is configured to be activated in response to the activation of the enable signal EN.

The shift register 500 serves as a delay control unit and is configured to adjust the delay times of the first loop 300 and the second loop 401 in response to the first phase comparison signal P1 and the second phase comparison signal P2.

The shift register 500 adjusts the delay time of the first delay line 310 in response to the first phase comparison signal P1.

The shift register 500 adjusts the delay time of the second delay line 411 in response to the second phase comparison signal P2.

The phase mixing unit 601 is configured to mix the first preliminary clock signal UCLK and the second preliminary clock signal DCLK using a weight generated in response to a duty detection signal DT, and generate a phase-mixed clock signal UDCLK.

Basically, the phase mixing unit 601 may be configured in the same manner as the phase mixing unit 600 shown in FIG. 3.

The phase mixing unit 601 is configured to be activated in response to the activation of the enable signal EN. Also, the phase mixing unit 601 is configured to bypass the first preliminary clock signal UCLK when the enable signal EN is deactivated, and output the phase-mixed clock signal UDCLK.

The driver 700 is configured to drive the phase-mixed clock signal UDCLK and output a delay locked clock signal DLL CLK.

The control unit 801 is configured to control the slew rate control unit 201 and the phase mixing unit 601 in response to the phase-mixed clock signal UDCLK.

The control unit 801 includes a duty detecting section 811 and a code generating section 821.

The duty detecting section 811 is configured to compare the high level duration and low level duration of the phase-mixed clock signal UDCLK and output a comparison result as the duty detection signal DT.

For example, the duty detecting section 811 may be configured to output the duty detection signal DT with a logic high level in the case where the high level duration of the phase-mixed clock signal UDCLK is longer than the low level duration of the phase-mixed clock signal UDCLK and output the duty detection signal DT with a logic low level in an opposite case.

The code generating section 821 is configured to generate the code signal DCC_CODE in response to the duty detection signal DT.

The code generating section 821 increases, maintains, or decreases the value of the code signal DCC_CODE depending upon a logic level of the duty detection signal DT.

The code generating section 821 is configured to be activated when the enable bar signal ENB is deactivated.

Figure 6:
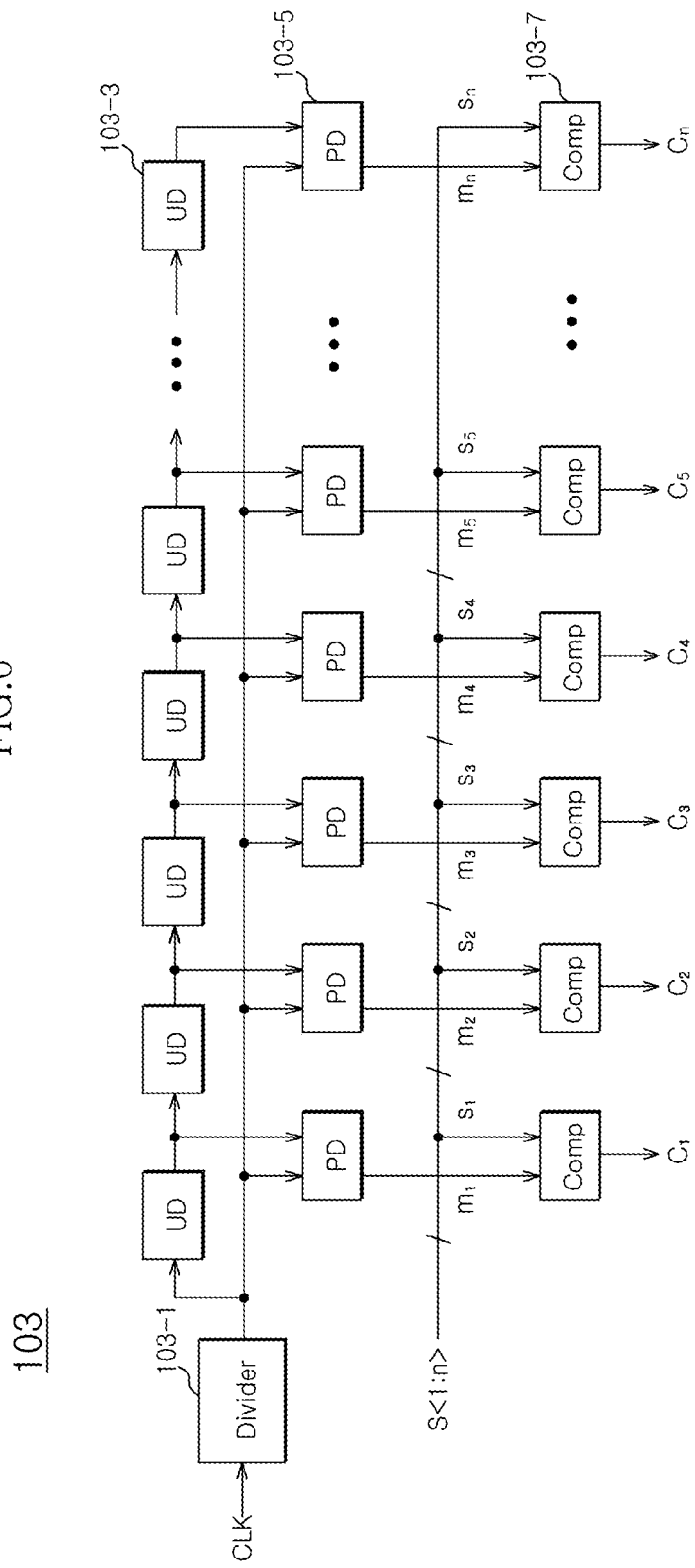
FIG. 6 is a block diagram of the time/digital information converting section shown in FIG. 5.

Referring to FIG. 6, the time/digital information converting section 103 includes a plurality of unit delays (UD) 103-3, a plurality of phase detectors (PD) 103-5, and a plurality of comparators (Comp) 103-7. In order to improve the precision of the preliminary frequency information C<1:n>, the time/digital information converting section 103 may further include a divider 103-1.

The plurality of unit delays 103-3 sequentially delay the clock signal CLK which is divided through the divider 103-1.

The plurality of phase detectors 103-5 compare the phases of the clock signal CLK divided through the divider 103-1 and the respective output signals of the plurality of unit delays 103-3, and output comparison values m<1:n>.

The plurality of comparators 103-7 compare the sampling values m<1:n> and the reference frequency information S<1:n> to check whether they correspond to each other, and output the preliminary frequency information C<1:n>.

An operation method depending upon a frequency according to an embodiment of the present invention will be described below with reference to FIG. 5.

For example, in the case where the clock signal CLK has a high frequency, the decoder 104 activates the enable signal EN.

When the enable signal EN is activated, the slew rate control unit 201 and the code generating section 821 are deactivated, and the second delay line 411, the second phase detector 431 and the phase mixing unit 601 are activated.

Accordingly, the first loop 300, the second loop 401 and the phase mixing unit 601 operate and the delay locked clock signal DLL CLK, for which delay locking and duty cycle compensation have been implemented, is generated.

That is to say, in an embodiment of the present invention, in the case where the clock signal CLK has a high frequency, the phase mixing unit 601 appropriate for a high frequency performs a duty cycle compensating operation.

In the case where the clock signal CLK has a low frequency, the decoder 104 deactivates the enable signal EN.

Since the enable signal EN is deactivated, the second delay line 411, the second phase detector 431 and the phase mixing unit 601 are deactivated, and the slew rate control unit 201 and the code generating section 821 are activated.

Accordingly, the slew rate control unit 201 and the first loop 300 operate and the delay locked clock signal DLL CLK, for which delay locking and duty cycle compensation have been implemented, is generated.

That is to say, in an embodiment of the present invention, in the case where the clock signal CLK has a low frequency, the slew rate control unit 201 performs a duty cycle compensating operation.

Here, if the phase mixing unit 601 does not operate, an operation of the second loop 401 is not needed. Accordingly, in an embodiment of the present invention, in the case where the phase mixing unit 601 is not operated, the second loop 401 is deactivated, and the circuit component elements of the shift register 500 associated with the second loop 401 are also deactivated, whereby current consumption may decrease.

In an embodiment of the present invention, the phase mixing unit 601 operates in a high frequency operation, and the slew rate control unit 201 and the first loop 300 operate in a low frequency operation. Therefore, operation performance may be ensured through entire regions including a high frequency region and a low frequency region, and current consumption may decrease.

As is apparent from the above descriptions, according to the embodiments of the present invention, an operation frequency range can be widened, and current consumption can be reduced.

While certain embodiments have been described above, it will be understood to those skilled in the art that the embodiments described are by way of example only. Accordingly, the phase control circuit described herein should not be limited based on the described embodiments. Rather, the phase control circuit described herein should only be limited in light of the claims that follow when taken in conjunction with the above description and accompanying drawings.

What is claimed is:

1. A phase control circuit comprising:
a first duty cycle correction circuit configured to correct a duty cycle of a clock signal;
a delay locked loop configured to perform delay locking of an output signal of the first duty cycle correction circuit;
a second duty cycle correction circuit configured to correct a duty cycle of an output signal of the delay locked loop;
an operating condition determination unit configured to determine a frequency information of the clock signal, and selectively activate one or more of the first duty cycle correction circuit, the second duty cycle correction circuit and the delay locked loop in response to the frequency information of the clock signal; and
an operating condition determination unit configured to determine the frequency information of the clock signal by comparing sampling values acquired by sampling the clock signal with a reference frequency information.

2. The phase control circuit according to claim 1, wherein the first duty cycle correction circuit is configured to correct the duty cycle of the clock signal by controlling a slew rate of the clock signal.

3. The phase control circuit according to claim 1, wherein the delay locked loop comprises a first loop and a second loop which are configured to independently adjust a delay time of the output signal of the first duty cycle correction circuit.

4. The phase control circuit according to claim 3, wherein the second duty cycle correction circuit is configured to correct the duty cycle of the output signal of the delay locked loop by mixing phases of an output signal of the first loop and an output signal of the second loop.

5. The phase control circuit according to claim 1, wherein the operating condition determination unit comprises:
a time/digital information converting section configured to compare the sampling values and the reference frequency information, and generate preliminary frequency information; and
a decoder configured to decode the preliminary frequency information and generate a signal for selectively activating the first duty cycle correction circuit and the second duty cycle correction circuit.

6. A phase control circuit comprising:
a first duty cycle correction circuit configured to correct a duty cycle of a clock signal and generate a reference clock signal;
a first loop configured to generate a first preliminary clock signal in response to the reference clock signal;
a second loop configured to generate a second preliminary clock signal in response to the reference clock signal;
a second duty cycle correction circuit configured to correct a duty cycle of the first preliminary clock signal using the second preliminary clock signal; and
an operating condition determination unit configured to determine a frequency information of the clock signal and selectively activate one or more of the first duty cycle correction circuit, the second duty cycle correction circuit and the second loop in response to the frequency information of the clock signal,
wherein, if the first duty cycle correction circuit is activated, the second duty cycle correction circuit and the second loop are deactivated.

7. The phase control circuit according to claim 6, wherein, if the second duty cycle correction circuit and the second loop are activated, the first duty cycle correction circuit is deactivated.

8. The phase control circuit according to claim 6, wherein the first duty cycle correction circuit is configured to correct the duty cycle of the clock signal by controlling a slew rate of the clock signal.

9. The phase control circuit according to claim 6, wherein the first loop comprises:
a first delay line configured to delay the reference clock signal by a adjusted delay time and generate the first preliminary clock signal;
a first replica delay configured to delay the first preliminary clock signal by a preset delay time and output a first feedback clock signal; and
a first phase detector configured to compare phases of the first feedback clock signal and the reference clock signal and output a first phase comparison signal.

10. The phase control circuit according to claim 9, wherein the second loop comprises:
a second delay line configured to delay the reference clock signal by a adjusted delay time and generate the second preliminary clock signal;
a second replica delay configured to delay the second preliminary clock signal by a preset delay time and output a second feedback clock signal; and
a second phase detector configured to compare phases of the second feedback clock signal and the reference clock signal and output a second phase comparison signal.

11. The phase control circuit according to claim 10, further comprising:
a shift register configured to adjust delay times of the first delay line and the second delay line in response to the first phase comparison signal and the second phase comparison signal.

12. The phase control circuit according to claim 10, wherein the second delay line and the second phase detector are configured to be activated when the second duty cycle correction circuit is activated.

13. The phase control circuit according to claim 6, wherein the second duty cycle correction circuit is configured to mix phases of the first preliminary clock signal and the second preliminary clock signal.

14. The phase control circuit according to claim 6, wherein the operating condition determination unit comprises:
a time/digital information converting section configured to compare sampling values acquired by sampling the clock signal and reference frequency information and generate preliminary frequency information; and
a decoder configured to decode the preliminary frequency information and generate a signal for selectively activating one or more of the first duty cycle correction circuit, the second duty cycle correction circuit and the second loop.

15. The phase control circuit according to claim 6, wherein the operating condition determination unit is configured to determine the frequency information of the clock signal by comparing sampling values acquired by sampling the clock signal with a reference frequency information.

* * * * *